United States Patent
Liu et al.

(10) Patent No.: US 8,975,928 B1
(45) Date of Patent: Mar. 10, 2015

(54) INPUT-OUTPUT BUFFER CIRCUITRY WITH INCREASED DRIVE STRENGTH

(71) Applicant: Altera Corporation, San Jose, CA (US)

(72) Inventors: Jun Liu, Milpitas, CA (US); Yanzhong Xu, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/871,931

(22) Filed: Apr. 26, 2013

(51) Int. Cl.
  *H03K 3/00* (2006.01)
  *H03K 17/10* (2006.01)

(52) U.S. Cl.
  CPC ...................................... *H03K 17/10* (2013.01)
  USPC .......................................................... 327/108

(58) Field of Classification Search
  None
  See application file for complete search history.

(56) References Cited

U.S. PATENT DOCUMENTS

| | | | |
|---|---|---|---|
| 4,114,049 A | 9/1978 | Suzuki | |
| 4,175,290 A | 11/1979 | Harari | |
| 4,387,444 A | 6/1983 | Edwards | |
| 4,714,519 A | 12/1987 | Pfiester | |
| 4,894,801 A | 1/1990 | Saito et al. | |
| 5,175,605 A | 12/1992 | Pavlu et al. | |
| 5,296,401 A | 3/1994 | Mitsui et al. | |
| 5,355,333 A * | 10/1994 | Pascucci | 365/189.15 |
| 5,363,328 A | 11/1994 | Browning, III et al. | |
| 5,424,656 A * | 6/1995 | Gibson et al. | 326/63 |
| 5,576,238 A | 11/1996 | Fu | |
| 5,583,067 A | 12/1996 | Sanchez | |
| 5,753,958 A | 5/1998 | Burr et al. | |
| 5,977,591 A | 11/1999 | Fratin et al. | |
| 6,033,957 A | 3/2000 | Burns, Jr. et al. | |
| 6,097,070 A | 8/2000 | Mandelman | |
| 6,110,783 A | 8/2000 | Burr | |
| 6,255,174 B1 | 7/2001 | Yu | |
| 6,278,290 B1 | 8/2001 | Young | |
| 6,466,489 B1 | 10/2002 | Ieong et al. | |
| 6,487,134 B2 | 11/2002 | Thoma et al. | |
| 6,501,295 B1 | 12/2002 | Burr | |
| 6,620,679 B1 | 9/2003 | Tzeng et al. | |
| 6,642,697 B2 * | 11/2003 | Zuniga et al. | 323/223 |
| 6,653,698 B2 | 11/2003 | Lee et al. | |

(Continued)

FOREIGN PATENT DOCUMENTS

| | | |
|---|---|---|
| CN | 1192053 | 9/1998 |
| CN | 1938858 | 3/2007 |

(Continued)

OTHER PUBLICATIONS

Sinha et al., U.S. Appl. No. 13/110,823, filed May 18, 2011.

(Continued)

*Primary Examiner* — Lincoln Donovan
*Assistant Examiner* — Khareem E Almo (57) ABSTRACT

Input-output (IO) buffer circuitry is provided that is operable to drive signals off an integrated circuit. The input-output circuitry may include an input-output driver having an asymmetric transistor and/or a low-threshold voltage transistor. The asymmetric transistor may include a first source-drain region at a first dopant concentration level and a second source-drain region at a second dopant concentration level. The first dopant concentration level and the second dopant concentration level may be different. The IO buffer circuitry may be able to prevent issues with regards to hot carrier injection when driving signals with elevated voltages. The IO buffer circuit may also be manufactured without increasing the overall cost.

20 Claims, 7 Drawing Sheets

(56) References Cited

U.S. PATENT DOCUMENTS

| | | | |
|---|---|---|---|
| 6,674,139 | B2 | 1/2004 | Mandelman |
| 6,807,081 | B2 | 10/2004 | Nii |
| 6,949,423 | B1 | 9/2005 | Ma et al. |
| 7,193,269 | B2 | 3/2007 | Toda et al. |
| 7,307,905 | B2 | 12/2007 | Najm et al. |
| 7,315,067 | B2 | 1/2008 | Wang |
| 7,332,780 | B2 | 2/2008 | Matsuda et al. |
| 7,362,606 | B2 | 4/2008 | Chuang et al. |
| 7,408,800 | B1 | 8/2008 | Braceras et al. |
| 7,436,696 | B2 | 10/2008 | Wang et al. |
| 7,504,850 | B2 | 3/2009 | Kuboyama et al. |
| 7,511,989 | B2 | 3/2009 | Thomas et al. |
| 7,532,501 | B2 | 5/2009 | Joshi et al. |
| 7,545,007 | B2 | 6/2009 | Greer et al. |
| 7,652,520 | B2 | 1/2010 | Gatta |
| 7,876,602 | B2 | 1/2011 | Lawrence et al. |
| 7,888,959 | B2 | 2/2011 | Cannon et al. |
| 7,920,410 | B1 | 4/2011 | Lee et al. |
| 7,940,091 | B1 * | 5/2011 | Govindarajulu et al. ....... 327/91 |
| 8,036,022 | B2 | 10/2011 | Anderson et al. |
| 8,116,118 | B2 | 2/2012 | Thomas et al. |
| 8,410,826 | B2 * | 4/2013 | Koto et al. ................. 327/108 |
| 2001/0017390 | A1 | 8/2001 | Long et al. |
| 2003/0141525 | A1 | 7/2003 | Nowak |
| 2003/0181005 | A1 | 9/2003 | Hachimine et al. |
| 2005/0124160 | A1 | 6/2005 | Chiu et al. |
| 2005/0224897 | A1 | 10/2005 | Chen et al. |
| 2007/0029587 | A1 | 2/2007 | Greer et al. |
| 2007/0207575 | A1 | 9/2007 | Taniguchi et al. |
| 2007/0262382 | A1 | 11/2007 | Ishii et al. |
| 2008/0308870 | A1 | 12/2008 | Faul et al. |
| 2009/0185409 | A1 | 7/2009 | Bansal et al. |
| 2009/0321831 | A1 | 12/2009 | Cai et al. |
| 2010/0044801 | A1 | 2/2010 | Anderson et al. |
| 2010/0127331 | A1 | 5/2010 | Ratnakumar et al. |
| 2010/0127332 | A1 | 5/2010 | Liu et al. |
| 2010/0177556 | A1 | 7/2010 | Chen et al. |
| 2011/0089992 | A1 * | 4/2011 | Hunter et al. ................. 327/427 |
| 2011/0248748 | A1 * | 10/2011 | Koto et al. .................... 327/108 |

FOREIGN PATENT DOCUMENTS

| | | |
|---|---|---|
| CN | 101030556 | 9/2007 |
| WO | 2005096387 | 10/2005 |

OTHER PUBLICATIONS

Xiang et al., U.S. Appl. No. 12/069,271, filed Feb. 8, 2008.
Xiang et al., U.S. Appl. No. 60/964,917, filed Aug. 16, 2007.
Kim et al., "Relaxing Conflict Between Read Stability and Writability in 6T SRAM Cell Using Asymmetric Transistors", IEEE Electron Device Letters, vol. 30, No. 8, Aug. 2009.
Zhou et al. "A Novel Hetero-Material Gate (HMG) MOSFET for Deep-Submicron ULSI Technology", IEEE Transactions on Electron Devices, vol. 45, No. 12, Dec. 1998.
Liu et al., U.S. Appl. No. 12/629,831, filed Dec. 2, 2009.
Rahim et al., U.S. Appl. No. 12/568,638, filed Sep. 28, 2009.
Lee et al., U.S. Appl. No. 12/391,230, filed Feb. 23, 2009.
Liu et al., U.S. Appl. No. 13/408,959, filed Feb. 29, 2012.
Liu et al., U.S. Appl. No. 12/790,660, filed May 28, 2010.

* cited by examiner

INPUT-OUTPUT BUFFER CIRCUITRY WITH INCREASED DRIVE STRENGTH

BACKGROUND

Generally, input-output (IO) circuitry may be utilized for conveying signals into and out of an integrated circuit (IC). As semiconductor technology advances, the size of the channel formed between the drain and the source of a transistor within IO circuitry shrinks. As the size of the channel becomes smaller, the maximum voltage that may be applied across the channel decreases. However, voltage requirements imposed by different IO standards have remained somewhat constant. Therefore, IO circuitry designs may have to be modified to satisfy the requirements of different IO standards.

To meet an IO standard, IO circuitry typically use stacked transistors to output a high voltage signal from the integrated circuit. However, transistors with shorter channel lengths may be more susceptible to hot carrier injection failures since transistors with shorter channel lengths may exhibit a lower threshold voltage compared to transistors with longer channels. A hot carrier injection phenomenon occurs when an electron in the transistor channel with sufficient energy (hence the term 'hot') enters the gate dielectric of the transistor.

The hot carrier injection phenomenon may be mitigated by utilizing high voltage transistors. However, utilizing high voltage transistors may require additional manufacturing process steps, resulting in increased cost. Therefore, utilizing high voltage transistors may be undesirable.

It is within this context that the embodiments described herein arise.

SUMMARY

Embodiments described herein include input-output circuitry and a method of manufacturing the input-output circuitry. It should be appreciated that the embodiments can be implemented in numerous ways, such as a process, an apparatus, a system, a device, or a method. Several embodiments are described below.

In one embodiment, an input-output (IO) buffer circuit is disclosed. The IO buffer circuit may include asymmetric transistors or transistors with different threshold voltages. The IO buffer circuit may be able to prevent hot carrier injection when transferring signals at high voltages.

In one embodiment, an integrated circuit is described. The integrated circuit may include input-output circuitry that is operable to drive signals off the integrated circuit. The input-output circuitry may include an input-output driver having an asymmetric transistor.

In another embodiment, another integrated circuit is described. The integrated circuit includes input-output circuitry that is operable to interface with external circuitry according to a communications protocol. The input-output circuitry may include a first pull-down device having a first threshold voltage and a second pull-down device having a second threshold voltage that is different than the first pull-down device.

In an alternative embodiment, a method of manufacturing input-output circuitry on an integrated circuit is provided. The input-output circuitry may be utilized for outputting a signal from the integrated circuit. The method includes forming a first transistor having a first threshold voltage implant characteristic and forming a second transistor having a second threshold voltage implant characteristic. The first threshold voltage implant characteristic is different than the second threshold voltage implant characteristic. It should be appreciated that the first and second transistors may be coupled between a power supply line and an output of the input-output circuitry on which the signal may be provided.

Further features of the invention, its nature and various advantages will be more apparent from the accompanying drawings and the following detailed description of the preferred embodiments.

DETAILED DESCRIPTION

The following embodiments describe input-output circuitry and a method of manufacturing the input-output circuitry. It will be obvious, however, to one skilled in the art, that the present exemplary embodiments may be practiced without some or all of these specific details. In other instances, well-known operations have not been described in detail in order not to unnecessarily obscure the present embodiments.

Figure 1:
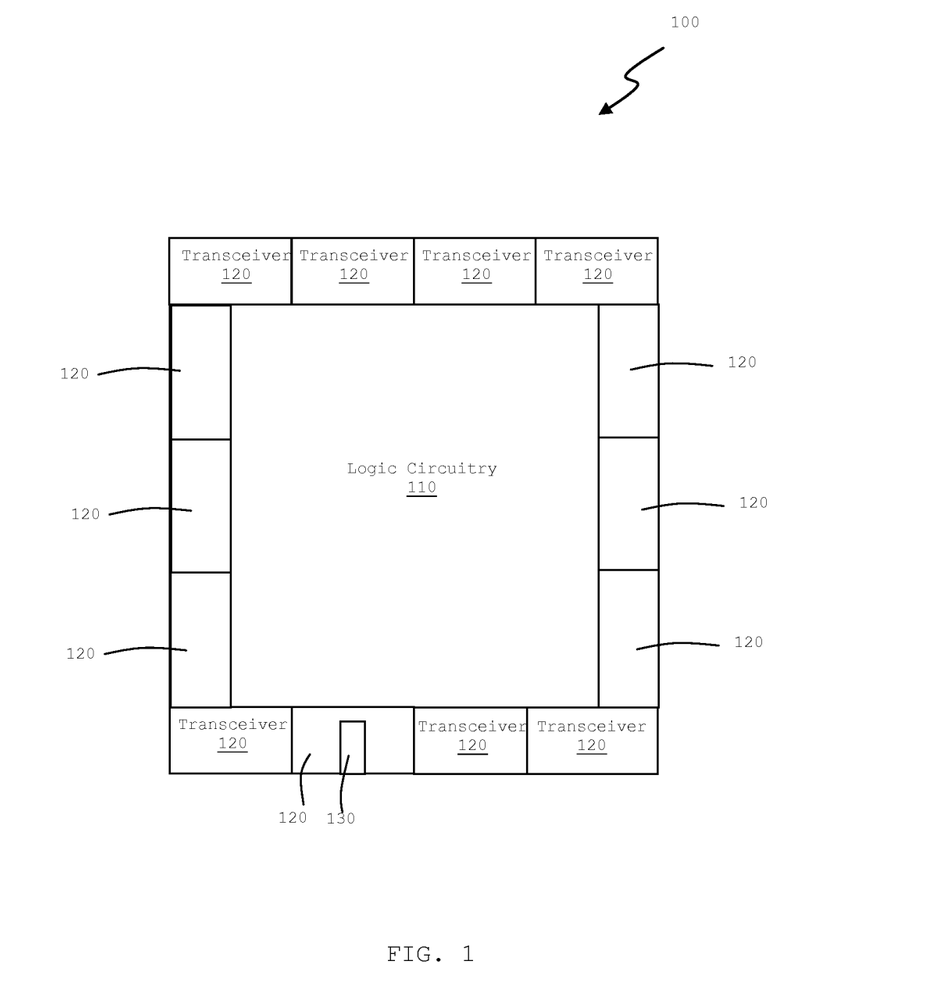
FIG. 1 shows an illustrative integrated circuit in accordance with one embodiment of the present invention.

FIG. 1, meant to be illustrative and not limiting, illustrates an integrated circuit in accordance with one embodiment of present invention. Integrated circuit 100 may be an application specific integrated circuit (ASIC) device, an application standard specific product (ASSP) device or a programmable logic device (PLD). ASIC and ASSP devices may perform a fixed and dedicated function whereas a PLD device may be programmable to perform various functions. An example of PLD device may be a Field Programmable Gate Array (FPGA) device.

Integrated circuit 100 may form a part of a wireless system, a wired system, or other type of system. Therefore, integrated circuit 100 may include circuits dedicated to perform various functions that define the system. In one embodiment, integrated circuit 100 may be a memory controller device. The memory controller device may be utilized for controlling data transfer between a memory device and other devices, for example, a microprocessor device. Hence, integrated circuit 100 may include circuits defined by protocol standards applicable to integrated circuit 100 and other devices, such as, memory devices. An example of a memory communication standard may be the Joint Electronic Devices Engineering Council (JEDEC) memory standard.

Integrated circuit 100 may include logic circuitry 110 and a plurality of transceivers 120. In the embodiment of FIG. 1, the plurality of transceivers 120 are in the peripheral portion of integrated circuit 100 and logic circuitry 100 is in the middle portion of integrated circuit 100. It should be appreciated that the arrangement of transceivers 120 and logic circuitry 110 on integrated circuit 100 may vary depending on requirements of a particular design.

Logic circuitry 110 may be utilized for performing core functions of integrated circuit 100. It should be appreciated that logic circuitry 110 may include circuits specific to the functions that define integrated circuit 100. For example, logic circuitry 110 may include circuits to perform memory device addressing and processing of information retrieved from the memory device when integrated circuit 100 is used as a memory controller. In another example, logic circuitry 110 may include programmable logic elements when integrated circuit is a PLD. The programmable logic elements may further include circuits such as look-up table circuitry, multiplexers, product-term logic, registers, memory and the like, as person skilled in the art with the benefit of description of the invention understands. The programmable logic elements may be programmed by a user to perform any desired function.

A signal from logic circuitry 110 may be transferred out of integrated circuit 100 though one of the plurality of transceivers 120. Similarly, a signal received from an external device (external to integrated circuit 100) may be transmitted to logic circuitry 110 through one of the plurality of transceivers 120. Therefore, transceivers 120 may be known as external interfacing circuitry of integrated circuit 100.

Figure 2:
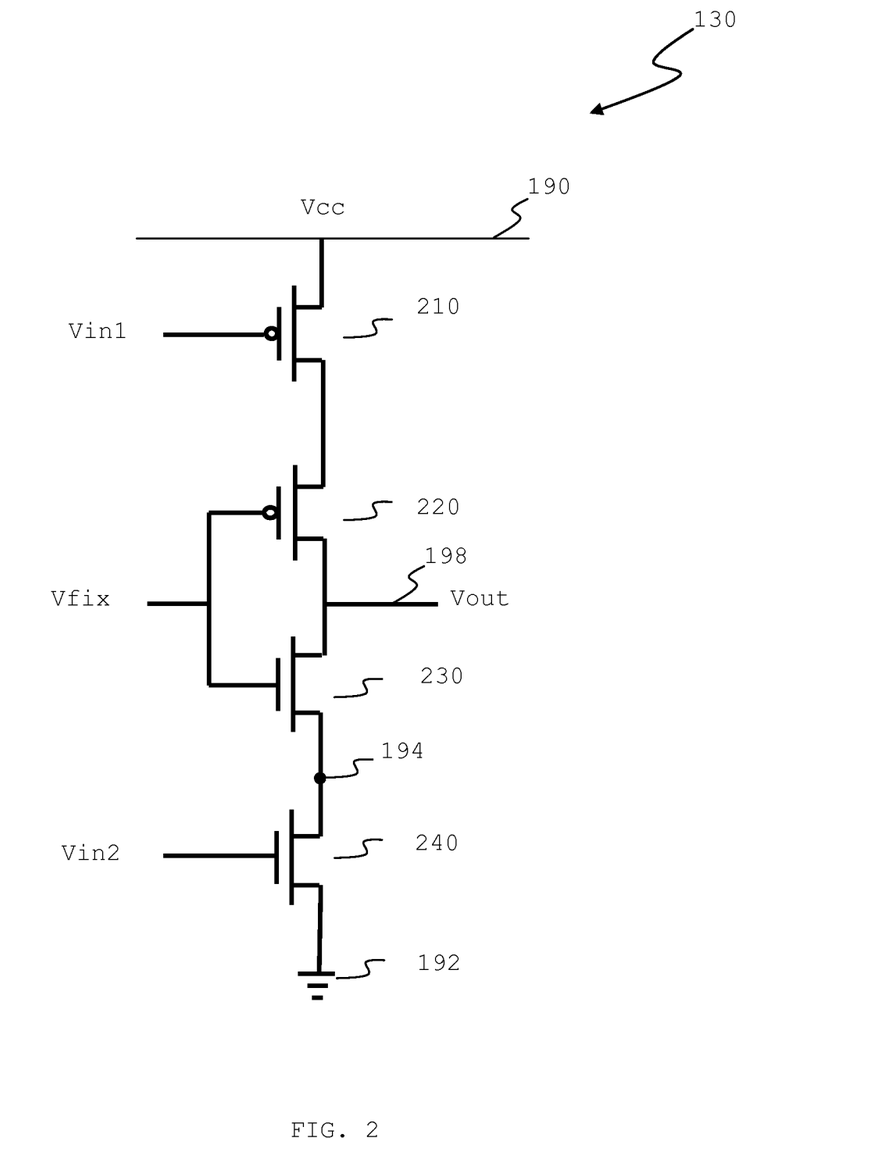
FIG. 2 is a circuit diagram of an illustrative input-output (IO) buffer circuit with transistors arranged in a stacked configuration in accordance with one embodiment of the present invention.

Referring still to FIG. 1, transceiver 120 may further include input-output (IO) buffer 130. IO buffer 130 may be utilized for aligning the speeds of input/output signals of the plurality of transceivers 120. IO buffer 130 may also be tulized to increase the signal strength of the input/output signals. IO buffer 130 may include an input circuit element, an output circuit element, an ESD protection element, and the like. In an exemplary embodiment, IO buffer 130 may include circuitry as illustrated in FIG. 2. It should be appreciated that each transceiver 120 may include at least one IO buffer 130.

FIG. 2, meant to be illustrative and not limiting, illustrates an input-output (IO) buffer circuit with transistors arranged in a stacked configuration in accordance with one embodiment of the present invention. A signal may be transferred between an integrated circuit (e.g., integrated circuit 100 of FIG. 1) and an external device (e.g., a memory device) utilizing IO buffer 130.

P-channel Metal Oxide Semiconductor (PMOS) transistors 210 and 220, and N-channel Metal Oxide Semiconductor (NMOS) transistors 230 and 240 forms the circuit of IO buffer 130. PMOS transistors 210 and 220 and NMOS transistors 230 and 240 may be manufactured for a specific maximum gate-source voltage (Vgs) and a specific maximum gate-drain voltage (Vgd). In one embodiment, PMOS transistors 210 and 220 and NMOS transistor 230 and 240 may be manufactured for a maximum Vgd and Vgs of 1.8 volts (V). It should be appreciated that the maximum voltage value of Vgs and Vgd is a maximum voltage difference across the gate and source terminals and a maximum voltage difference across the gate and drain terminals of a transistor, respectively. Voltages greater than 1.8 V for Vgd and Vgs may cause reliability concern.

In FIG. 2, PMOS transistors 210 and 220 and NMOS transistors 230 and 240 are arranged to form a 'stack.' A 'stack' may be a term commonly used to refer to transistors that are coupled together in series. For example, PMOS transistor 210 is coupled PMOS transistor 220, PMOS transistor 220 is coupled to NMOS transistor 230, and NMOS transistor 230 is coupled to NMOS transistor 240 serially in the circuit schematic of IO buffer 130. It should be appreciated that the stack design may also be known as a cascode design.

Referring still to FIG. 2, a drain terminal of PMOS transistor 210 is coupled to a source terminal of PMOS transistor 220, a drain terminal of PMOS transistor 220 is coupled to a drain terminal of NMOS transistor 230 and a source terminal of NMOS transistor 230 is coupled to a drain terminal of NMOS transistor 240. A source terminal of PMOS transistor 210 is coupled to power supply 190 that supplies a Vcc voltage (preferably 3.0 V, in one embodiment) and a source terminal of NMOS transistor 240 is coupled to ground terminal 192. Drain terminals of PMOS transistor 220 and NMOS transistor 230 are also coupled to output terminal 198, which may transfer signals out of the integrated circuit.

PMOS transistors 210 and 220 and NMOS transistors 230 and 240 may form a driver circuit within IO buffer 130. PMOS transistors 210 and 220 form a pull-up circuit, which pulls the output signal up from a ground voltage to a Vcc voltage and NMOS transistors 230 and 240 form a pull-down circuit, which pulls the output signal down from a Vcc voltage to a ground voltage in the driver circuit.

A gate terminal of PMOS transistor 210 may receive a first input signal (Vin1) and a gate terminal of NMOS transistor 240 may receive a second input signal (Vin2). Both input signals, Vin1 and Vin2, may be digital signals. In one instance, Vin1 may be a logic "1" signal when the input voltage is at 3.0 V and a logic "0" signal when the input voltage is at 1.5 V. Accordingly, Vin2 may be a logic 1 signal when its input voltage is at 1.5 V and a logic "0" signal when its input voltage is at 0 V. Gate terminals of PMOS transistor 220 and NMOS transistor 230 may be coupled to a constant voltage, Vfix, for example, 1.5 V.

IO buffer 130 generates an output signal (Vout) at output terminal 198. In one embodiment, Vout signal may vary from 0 V to 3.0 V. As an example, IO buffer 130 may output a 3.0 V signal when both Vin1 and Vin2 are at a logic low level (e.g., when Vin1 and Vin2 are at 1.5 V and 0 V, respectively). The source and drain terminals of PMOS transistor 210 are at 3.0 V when Vin1 is at 1.5 V and Vin2 is at 0 V. Furthermore, the source and drain terminals of PMOS transistor 220 are at 3.0 V, which may provide output signal of 3.0 V. The source and drain terminals of NMOS transistor 230 may also be at 3.0 V. However, NMOS transistor 240 may not be activated as Vin2, which is at 0 V, may not be sufficient voltage to switch on NMOS transistor 240.

Alternatively, IO buffer 130 outputs a zero volt signal when Vin1 is at logic level "1," (e.g., 3.0 V), and when Vin2 is at logic level "1," (e.g., 1.5 V). PMOS transistors 210 and 220 are switched off when Vin1 is at 3.0 V and Vin2 is at 1.5 V. The source and drain terminals of NMOS transistor 240 are at 0 V. The source and drain terminals of NMOS transistor 230 are at 0 V, which may provide an output signal at 0 V. It should be appreciated that PMOS transistors 210 and 220 may be switched on when the respective gates of PMOS transistors 210 and 220 are supplied with a voltage of approximately 0 V and NMOS transistors 230 and 240 may be switched on when the respective gates of NMOS transistors 230 and 240 are supplied with a voltage of approximately 1.5 V.

PMOS transistors 210 and 220 and NMOS transistors 230 and 240 may vary in terms of their threshold voltages. In one embodiment, PMOS transistor 210 and NMOS transistor 240 may include source and drain regions with a standard threshold voltage (e.g., a threshold voltage of approximately 0.7 V). Additionally, PMOS transistor 220 and NMOS transistor 230 may include drain regions with a standard threshold voltage and source regions with a low threshold voltage (e.g., a threshold voltage of approximately 0.1 V). As a matter of convention, PMOS transistor 220 and NMOS transistor 230 with different source and drain threshold voltages may be termed as asymmetric transistors while PMOS transistor 210 and NMOS transistor 240 with identical source and drain threshold voltages may be termed as symmetric transistors. Cross-sections of asymmetric transistors (e.g., PMOS transistor 220 and NMOS transistor 230) and symmetric transistors (e.g., PMOS transistor 210 and NMOS transistor 240) are shown in FIGS. 3A-3D.

In an alternate embodiment, PMOS transistor 210 and NMOS transistor 240 may include source and drain at a standard threshold voltage, whereas PMOS transistor 220 and NMOS transistor 230 may include source and drain at a low threshold voltage. Cross-sections of low threshold voltage transistors (e.g., PMOS transistor 220 and NMOS transistor 230) may be shown in FIGS. 4A-4B.

It should be appreciated that a source or drain region with a low threshold voltage may have a voltage level that is lower than a source or drain region with a standard threshold voltage. Additionally, a low threshold voltage level may be higher than a ground voltage level, and a standard threshold voltage level may be higher than a power supply voltage level.

As an example, a standard threshold voltage transistor may refer to a transistor with a threshold voltage of 0.7 V whereas a low threshold voltage transistor may refer to a transistor with a threshold voltage that is lower than 0.7 V (e.g., 0.1 V). It should be appreciated that the threshold voltage values for the standard and low threshold voltage transistors may vary depending on multiple factors, for example, different semiconductor process nodes and technology.

Figure 5A:
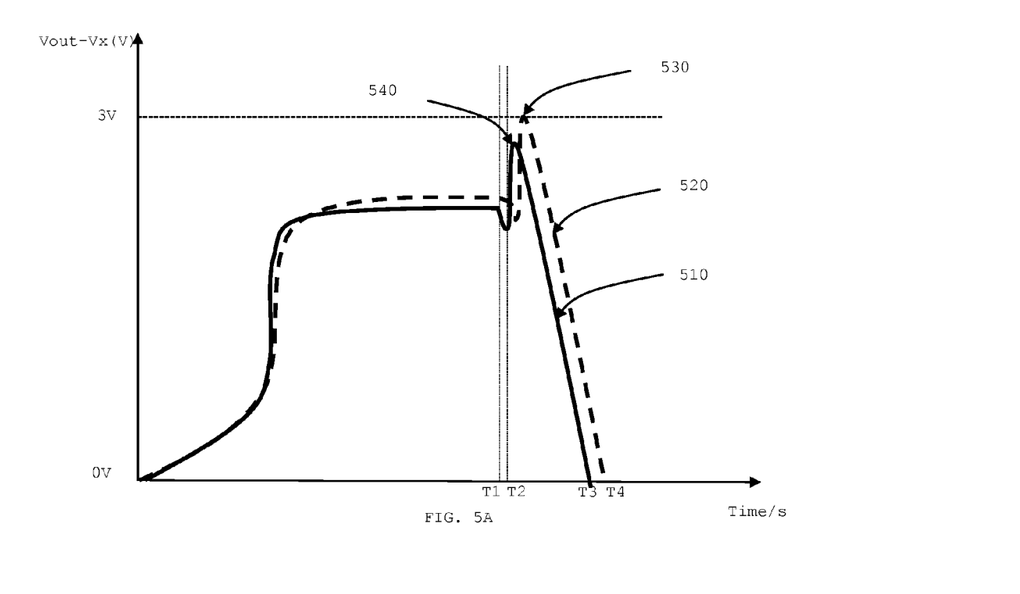
FIGS. 5A and 5B show voltage levels across an n-channel transistor in accordance with one embodiment of the present invention.

IO buffer 130 having asymmetric transistors (e.g., PMOS transistor 220 and NMOS transistor 230), may be able to discharge from a logic high level to a logic low level (e.g., from 3.0 V to 0 V) faster compared to symmetric transistors as shown by the waveform of FIG. 5A. Similarly, IO buffer 130 with low threshold voltage PMOS transistor 220 and NMOS transistor 230 may also be able to discharge from a logic high level to a logic low level (e.g., from 3.0 V to 0 V) faster compared to standard threshold voltage transistors.

It should be appreciated that there may be different methods for fabricating source and drain regions of a transistor with different threshold voltage characteristics (e.g., utilizing channel and halo implantation optimization alone or in combination with enlarging a channel length of the device). For example, a standard threshold voltage source or drain region may be achieved by heavily implanting the device's channel/halo pockets and enlarging its gate length, subsequently enlarging its channel length. The heavier implantation process may cause junction leakage and/or mobility degradation. Asymmetric transistors, on the other hand, may be manufactured through an angled implantation process. It should be appreciated that in order to not unnecessarily obscure the present invention, the details of the angled implantation process are not described herein.

Figure 3A:
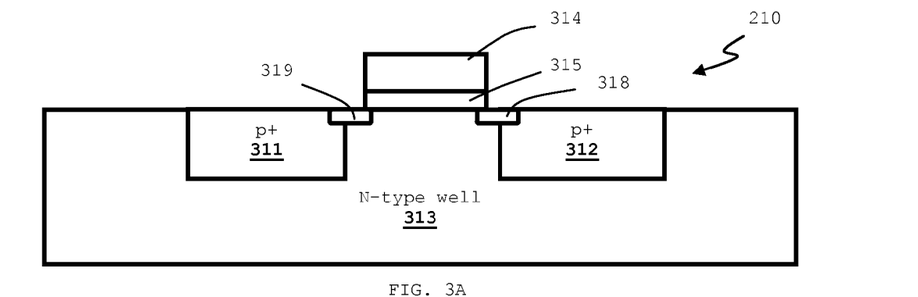
FIGS. 3A-3D and 4A-4B are diagrams showing cross-sectional side views of p-channel transistors and n-channel transistors in the IO buffer circuit in accordance with one embodiment of the present invention.

FIG. 3A shows a cross-section of PMOS transistor 210 in accordance with one embodiment of the present invention. PMOS transistor 210 includes gate 314, gate dielectric 315, source region 311, drain region 312, lightly-doped drain (LDD) regions 318 and 319 and N-type well 313. Gate 314 may be utilized for switching PMOS transistor 210 on and off. Gate 314 may be composed of polycrystalline silicon material. Gate dielectric 315 may be a barrier between gate 314 and N-type well 313. Voltage applied to gate 314 may induce a conductive channel between drain region 311 and source region 312 through gate dielectric 315.

Referring still to FIG. 3A, PMOS transistor 210 includes drain region 312 and source region 311 that may be implanted with P+ dopants (e.g., Boron). Drain region 312 and source region 311 may be implanted so that PMOS transistor 210 may be a standard threshold voltage transistor.

LDD regions 318 and 319 on PMOS transistor 210 may be formed at the upper portion of source region 311 and drain region 312 respectively. LDD regions 318 and 319 may be doped with similar dopants as drain and source regions 312 and 311 (e.g., Boron).

It should be appreciated that LDD regions (e.g., LDD regions 318 and 319) are utilized for reducing a hot carrier injection effect. The hot carrier injection effect, as described above, is a phenomenon whereby electrons may inject itself into a dielectric of a gate when they gain enough energy. Implementing LDD regions may somewhat decrease the electrical fields surrounding the dielectric of a gate since the LDD regions generally have a lower number of electrons compared to typical source and drain regions, which in turn decreases the hot carrier injection effect.

Figure 3B:
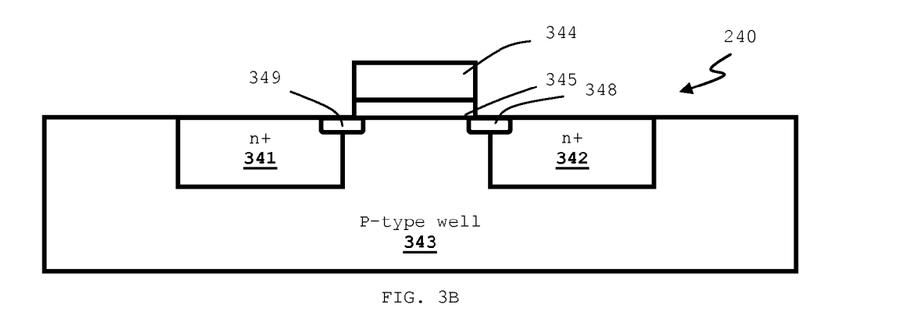

FIG. 3B shows a cross-section of NMOS transistor 240 in accordance with one embodiment of the present invention. NMOS transistor 240 includes gate 344, gate dielectric 345, source region 341, drain region 342, LDD regions 348 and 349 and P-type well 343. Gate 344 and gate dielectric 345 may be similar to gate 314 and gate dielectric 315 of FIG. 3A and as such, for the sake of brevity, will not be described in detail again.

Referring still to FIG. 3B, NMOS transistor 240 includes drain region 342 and source region 341 that may be implanted with N+ dopants (e.g., Phosphorous). Drain region 342 and source region 341 may form a standard threshold voltage transistor. LDD regions 348 and 349 are similar to LDD regions 318 and 319 of FIG. 3A with one exception that LDD regions 348 and 349 may be implanted with N+ dopants instead of P+ dopants.

Figure 3C:
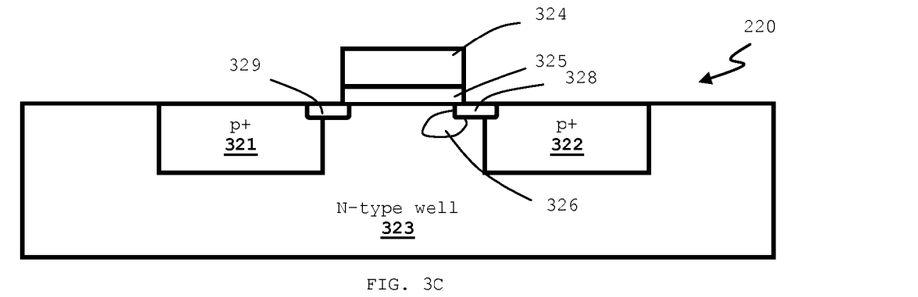

FIG. 3C shows a cross-section of PMOS transistor 220 with pocket implant region 326 in accordance with one embodiment of the present invention. It should be appreciated that apart from the additional pocket implant region 326, other aspects of PMOS transistor 220 (e.g., gate 314, gate dielectric 315, source region 312, drain region 311, etc.) may be similar to PMOS transistor 210 of FIG. 3A.

Drain region 311 and source region 312 may be formed through a vertical implantation beam process whereas pocket implant region 326 may be formed through an angled implantation beam process. Pocket implant region 326 may be implanted with P+ dopants. It should be appreciated that the terms "pocket" may refer to the shape pocket implant region 326 forms within the N-well 323. In one embodiment, the source region 312 of PMOS transistor 220 with pocket implant region 326 may have a lower threshold voltage compared to its drain region 311.

Figure 3D:
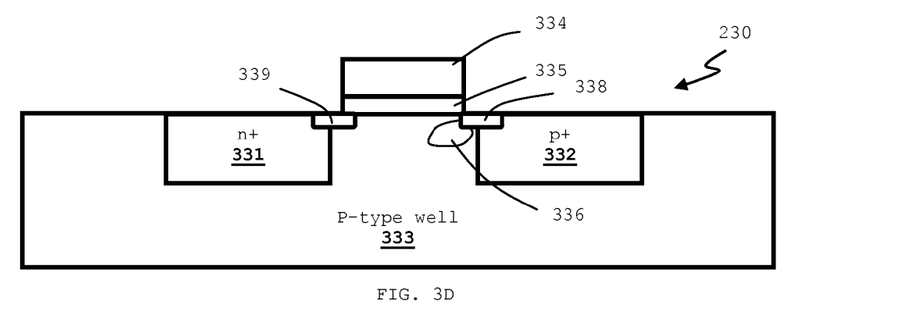

FIG. 3D shows a cross-section of NMOS transistor 230 with pocket implant region 336 in accordance with one embodiment of the present invention. It should be appreciated that apart from the additional pocket implant region 336, other aspects of NMOS transistor 230 (e.g., gate 344, gate dielectric 345, source region 342, drain region 341, etc.) may be similar to NMOS transistor 240 of FIG. 3B. In one embodiment, the source region 342 of NMOS transistor 230 with pocket implant region 336 may have a lower threshold voltage compared to its drain region 341. As described above, drain region 331 and source region 332 may be formed through a vertical implantation beam process whereas pocket implant region 336 may be formed through an angled implantation beam process.

It should be appreciated that FIGS. 3A and 3B show symmetric transistors with similar threshold voltages at their respective source and drain regions (e.g., both the source and drain regions may have standard threshold voltages), and FIGS. 3C and 3D show asymmetric transistors with different threshold voltages at their respective source and drain regions (e.g., the source region may have a low threshold voltage and while the drain region may have a standard threshold voltage).

Accordingly, it should be appreciated that the source and drain regions in a symmetric transistor (e.g., PMOS transistor 210 of FIG. 3A or NMOS transistor 240 of FIG. 3B) may be interchangeable and may commonly be referred to as source-drain regions. However, in an asymmetric transistor (e.g., PMOS transistor 220 of FIG. 3C or NMOS transistor 230 of FIG. 3D) where the source and drain regions may have different threshold voltages, the different regions (source and drain) may not be used interchangeably. As such, to ensure that an asymmetric transistor is correctly coupled when used in a circuit (e.g., IO buffer 130 of FIG. 2), its source and drain regions may need to be properly identified.

Figure 4A:
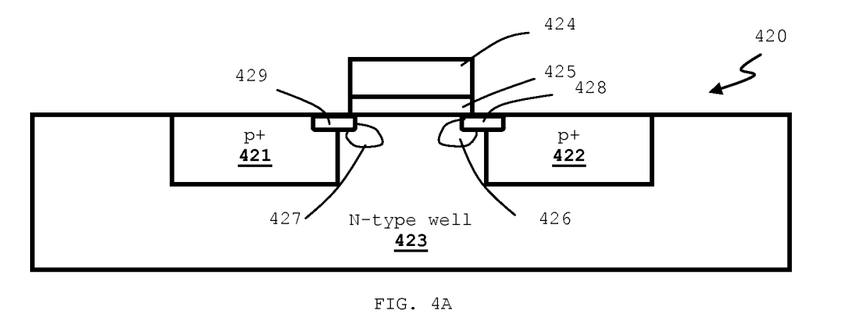
Figure 4B:
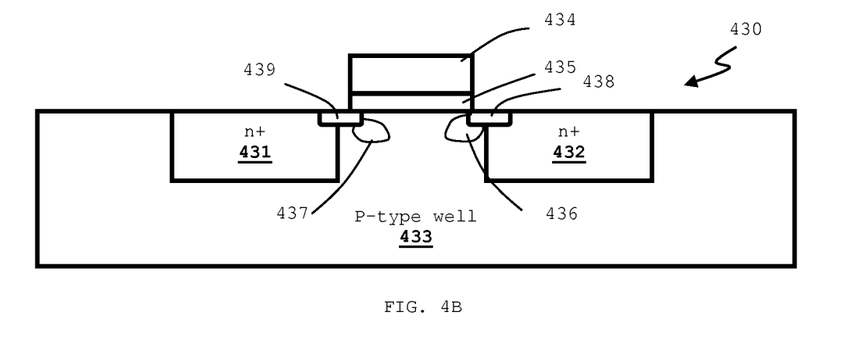

FIGS. 4A and 4B show symmetrical transistors with two pocket implant regions. In one embodiment, transistors 420 and 430 of FIGS. 4A and 4B, respectively, may be symmetrical transistors with a low threshold voltage. FIG. 4A shows PMOS transistor 420 with pocket implant regions 426 and 427 in accordance with one embodiment of the present invention. It should be appreciated that PMOS transistor 420 shares similarities with PMOS transistor 220 of FIG. 3C and as such, elements that have been described above will not be repeated.

However, unlike asymmetrical PMOS transistor 220 of FIG. 3C, PMOS transistor 420 of FIG. 4A has two pocket implant regions (e.g., pocket implants regions 426 and 427 at source region 422 and drain region 421, respectively), both doped with P+ dopants, instead of one. As such PMOS transistor 420 may be a symmetrical transistor. In one embodiment, with the additional pocket implant regions 426 and 427, symmetrical PMOS transistor 420 may have a lower threshold voltage compared to symmetrical PMOS transistor 210 of FIG. 3A.

FIG. 4B shows NMOS transistor 430 with pocket implant regions 436 and 437 in accordance with one embodiment of the present invention. In one embodiment, NMOS transistor 430 may be a symmetrical transistor similar to NMOS transistor 240 of FIG. 4B. However, with additional pocket implant regions 436 and 437, respectively, formed at its source and drain regions 432 and 431, NMOS transistor 430 may have a lower threshold voltage compared to NMOS transistor 240 of FIG. 4B. In the embodiment of FIG. 4B, source region 432, drain region 431, and pocket implant regions 436 and 437 may be implanted with N+ dopants. It should be appreciated that low threshold voltage symmetrical PMOS transistor 420 (as shown in FIG. 4A) and NMOS transistor 430 may be used in an IO buffer circuit. As an example, asymmetrical transistors 220 and 230 in IO buffer 130 of FIG. 2 may be replaced with low threshold voltage symmetrical transistors 420 and 430.

Figure 5B:
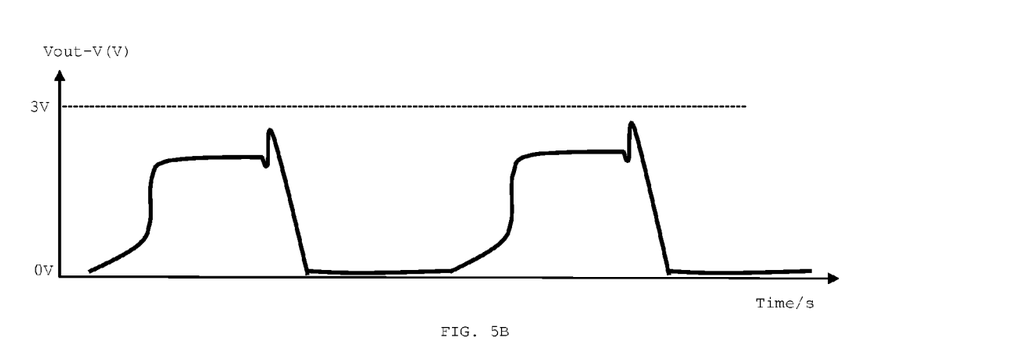

FIGS. 5A and 5B, meant to be illustrative and not limiting, illustrate voltage levels across an NMOS transistor (e.g., NMOS transistor 230 in IO buffer 130 of FIG. 2) as a function of time in accordance with one embodiment of the present invention. The vertical axis may represent a voltage difference between output terminal 198 and middle node 194 of FIG. 2. It should be appreciated that the voltages for middle node 194 may be represented by Vx. The horizontal axis, on the other hand, represents time in seconds.

In one embodiment, voltage waveform 510 may represent the voltage difference across an asymmetrical NMOS transistor in an IO circuit, asymmetrical NMOS transistor 230 in IO buffer 130 of FIG. 2. In another embodiment, voltage waveform 510 may represent the voltage difference across a symmetrical NMOS transistor with a low threshold voltage in an IO circuit (e.g., an IO circuit similar to IO buffer 130 of FIG. 2, but with symmetrical NMOS transistor 430 in place of asymmetrical NMOS transistor 230 or symmetrical PMOS transistor 420 in place of asymmetrical PMOS transistor 220).

Accordingly, voltage waveform 520 may represent the voltage difference across a symmetrical NMOS transistor, one with a standard threshold voltage, in an IO circuit. As an example, such an IO circuit may be relatively similar to IO buffer 130 of FIG. 2, but in this case, asymmetrical NMOS transistor 230 may be replaced with yet another symmetrical NMOS transistor with a standard threshold voltage, such as NMOS transistor 240 (and PMOS transistor 220 may be replaced with another symmetrical PMOS transistor such as PMOS transistor 210).

Referring still to FIG. 5A, voltage level 540, which is a voltage level less than 3.0 V, is the peak of voltage waveform 510. Voltage level 530, which is a voltage level of at least 3.0 V and above, is the peak of voltage waveform 520. Therefore, as shown in voltage waveforms 510 and 520, an asymmetrical NMOS transistor such as NMOS transistor 230 of FIG. 2 (or low voltage threshold symmetrical NMOS transistor such as NMOS transistor 430 of FIG. 4B) may have a lower voltage peak compared to a symmetrical NMOS transistor with a standard threshold voltage such as NMOS transistor 240 of FIG. 3B. In one embodiment, having a lower voltage peak may reduce the susceptibility of the transistor to hot carrier injection effects.

Furthermore, as shown in FIG. 5A voltage waveform 510 starts shifting from logic high to logic low at time T1. The voltage waveform 510 completes the shift at time T3. Voltage waveform 520 start shifting logic high to logic low at time T2 and completes the shifting at T4. As such, an IO circuit with asymmetrical transistors such as PMOS transistor 220 of FIG. 3C or NMOS transistor 230 of FIG. 3D (or symmetrical transistors with a low voltage threshold such as that shown in either FIG. 4A or FIG. 4B) shows an increased drive strength compared to an IO circuit with symmetrical transistors with standard threshold voltages. It should be appreciated that a drive strength may be defined by circuits capability to switch between different logic levels. FIG. 5B shows the voltage levels across an asymmetrical transistor (e.g., NMOS transistor 230 of FIG. 3D) for two clock cycles.

Figure 6:
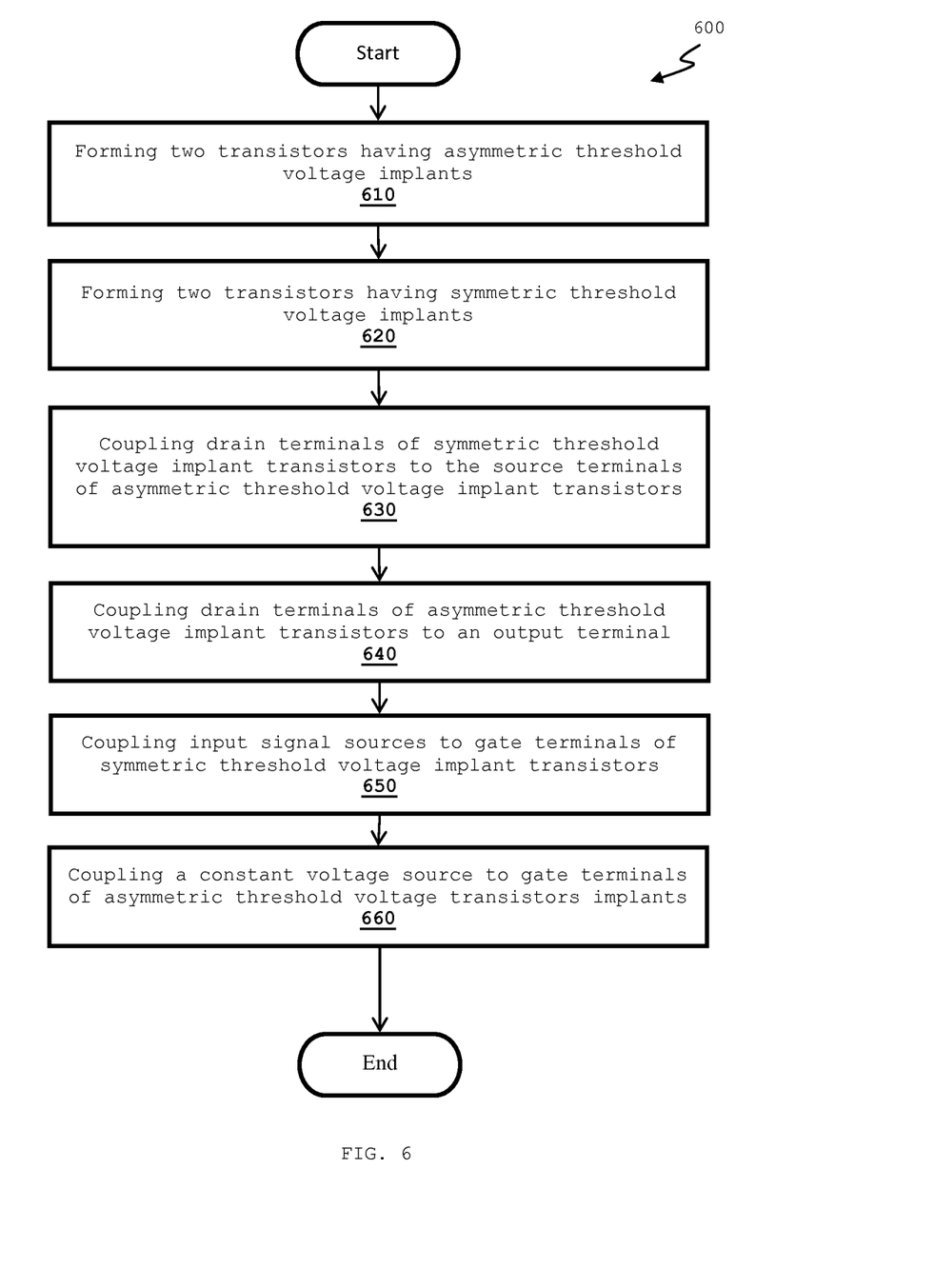
FIG. 6 is a flow chart of illustrative steps for forming an IO buffer with asymmetric transistors in accordance with one embodiment of the present invention.

FIG. 6, meant to be illustrative and not limiting, illustrates a method to form an IO buffer with asymmetric transistors in accordance with one embodiment of the present invention. As an example, method 600 may be utilized to manufacture IO buffer 130 of FIG. 2 that includes PMOS transistors 210 and 220 and NMOS transistors 230 and 240.

At step 610, two asymmetric threshold voltage transistors are formed. The cross-sections of the asymmetric transistors may be similar to cross-sections of PMOS transistor 220 and NMOS transistor 230 of FIGS. 3C and 3D, respectively. At step 620, two symmetric threshold voltage transistors are formed. The cross-sections of the symmetric transistors may be similar to cross-sections of PMOS transistor 210 and NMOS transistor 240 of FIGS. 3A and 3B, respectively.

It should be appreciated that the manufacturing process of symmetric transistors may include well-known steps such as performing a photolithography process, implanting dopants, performing etching, etc. However, the manufacturing process of asymmetric transistors that include a pocket implant region (e.g., pocket implant regions 326 and 336 of FIGS. 3C and 3D respectively) may include an additional step of implantation with an angled implantation beam.

At step 630, the drain terminals of the symmetric threshold voltage transistors are coupled to the source terminals of asymmetric threshold voltage transistors. At step 640, the drain terminals of the asymmetric threshold voltage transistors are coupled to an output terminal. Consequently, an IO buffer circuit with stacked transistors is formed immediately after steps 630 and 640. The stacked transistors in the IO buffer circuit may be similar to the arrangement of PMOS transistors 210 and 220 and NMOS transistors 230 and 240 of IO buffer 130 in FIG. 2.

At step 650, gate terminals of the symmetric transistors are coupled to input signal sources. In one embodiment, a symmetric transistor (e.g., PMOS transistor 210 of FIG. 2) is coupled to an input signal source that provides a signal (e.g., Vin1) and another symmetric transistor (e.g., NMOS transistor 240 of FIG. 2) is coupled to another input signal source that provides another signal (e.g., Vin2). Finally, at step 660, gate terminals of the asymmetric transistors (e.g., PMOS transistor 220 and NMOS transistor 230 of FIG. 2) are coupled to a constant voltage source. In one embodiment, the constant voltage source may be 1.5 V.

Figure 7:
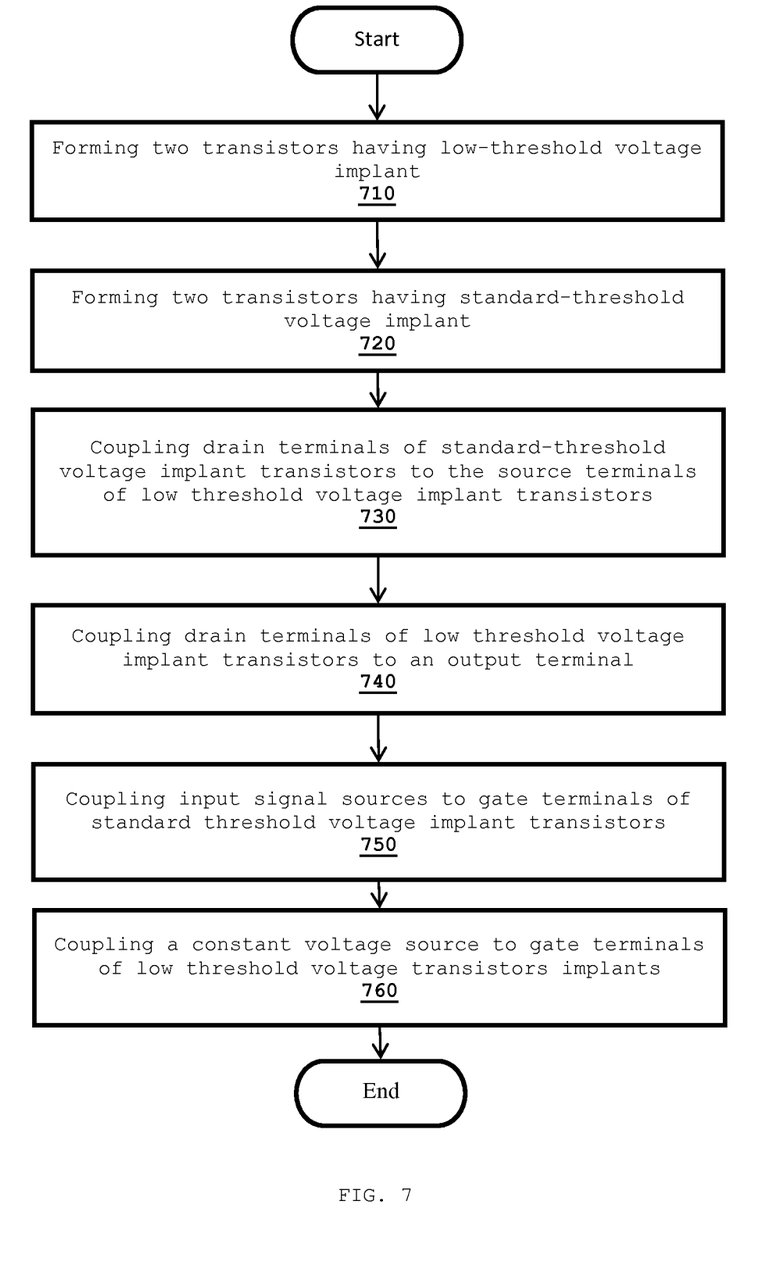
FIG. 7 is a flow chart of illustrative steps for forming an IO buffer with low voltage threshold transistors and standard voltage threshold transistors in accordance with one embodiment of the present invention.

FIG. 7, meant to be illustrative and not limiting, illustrates a method of forming an IO buffer with low voltage threshold transistors and standard voltage threshold transistors in accordance with one embodiment of the present invention. Method 700 may be utilized to manufacture an IO buffer circuit with low voltage threshold symmetrical transistors (e.g., transistors 420 and 430 of FIGS. 4A and 4B, respectively).

At step 710, two low threshold voltage transistors are formed. The cross-sections of the low threshold voltage transistors may be similar to the cross-sections of PMOS transistor 420 and NMOS transistor 430 of FIGS. 4A and 4B, respectively. At step 720, two standard threshold voltage transistors are formed. The cross-sections of the standard threshold voltage transistors may be similar to the cross-sections of PMOS transistor 210 and NMOS transistor 240 of FIGS. 3A and 3B, respectively.

In one embodiment, the low threshold voltage transistors may include pocket implant regions similar to pocket implant regions 426 and 427, and 436 and 437, respectively, of FIGS. 4A and 4B. The pocket implant regions may be formed using an angled implantation beam. It should be appreciated that steps 730-760 may be similar with steps 630-660 of FIG. 6 and therefore, for the sake of brevity, steps 730-760 are not described in detail again.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

The foregoing is merely illustrative of the principles of this invention and various modifications can be made by those skilled in the art without departing from the scope and spirit of the invention.

What is claimed is:

1. An integrated circuit, comprising:
    input-output circuitry operable to drive signals off of the integrated circuit, wherein the input-output circuitry includes an input-output driver having a first asymmetric transistor having a first channel doping type and a second asymmetric transistor having a second channel doping type that is different than the first channel doping type.

2. The integrated circuit defined in claim 1, wherein the first asymmetric transistor comprises a first source-drain region at a first dopant concentration level and a second source-drain region at a second dopant concentration level, and wherein the first dopant concentration level and the second dopant concentration level are different.

3. The integrated circuit as defined in claim 1, wherein the second asymmetric transistor comprises a first source-drain region at a first dopant concentration level and a second source-drain region at a second dopant concentration level, and wherein the first dopant concentration level is different than the second dopant concentration level.

4. The integrated circuit as defined in claim 3, wherein the input-output circuitry further comprises:
    a third transistor that is coupled in series with the second asymmetric transistor; and
    a fourth transistor that is coupled in series with the first asymmetric transistor, wherein the third and fourth transistors comprises source-drain regions with identical dopant concentration levels.

5. The integrated circuit as defined in claim 4, wherein the input-output driver includes at least two input terminals that are operable to receive a first input signal and a second input signal.

6. The integrated circuit as defined in claim 5, wherein the first input signal exhibits a voltage level between a first voltage level and a second voltage level, wherein the second input signal exhibits a voltage level between the second voltage level and a third voltage level, wherein the first voltage level is greater than the second voltage level, and wherein the second voltage level is greater than the third voltage level.

7. The integrated circuit as defined in claim 6, wherein the input-output driver outputs a signal exhibiting a voltage level that is between the first voltage level and the third voltage level.

8. An integrated circuit, comprising:
input-output circuitry operable to drive signals off of the integrated circuit, wherein the input-output circuitry includes an input-output driver having a first asymmetric transistor and a first additional transistor that is coupled in series with the asymmetric transistor, wherein the first additional transistor comprises a first source-drain region at a first dopant concentration level and a second source-drain region at a second dopant concentration level, and wherein the first dopant concentration level is different than the second dopant concentration level, wherein the asymmetric transistor comprises a N-channel transistor, and wherein the first additional transistor comprises a P-channel transistor.

9. An integrated circuit, comprising:
input-output circuitry operable to interface with external circuitry according to a communications protocol, wherein the input-output circuitry comprises a first pull-down device having a first threshold voltage and a second pull-down device having a second threshold voltage that is different than the first threshold voltage.

10. The integrated circuit defined in claim 9, wherein the input-output circuitry further comprises input terminals receiving an input signal and a constant voltage signal, and wherein the first pull-down device is supplied with the constant voltage signal and the second pull-down device is supplied with the input signal.

11. The integrated circuit defined in claim 10, further comprising:
a first pull-up device; and
a second pull-up device, wherein the first and second pull-up denies have different threshold voltages.

12. The integrated circuit defined in claim 11, wherein the first pull-up transistor receives the constant voltage signal, and wherein the second pull-up transistor receives another input signal.

13. The integrated circuit defined in claim 11, wherein the input-output circuitry outputs a signal that comprises a voltage level that is greater than a maximum voltage level that is applied across source-drain regions of the first and second pull-down devices and the first and second pull-up devices.

14. The integrated circuit defined in claim 9, wherein the first transistor has a first channel length, wherein the second transistor has a second channel length that is greater than the second channel length.

15. A method of manufacturing input-output circuitry on an integrated circuit (IC), wherein the input-output circuitry drives a signal off the integrated circuit, the method comprising:
forming a first transistor having a first threshold voltage implant characteristic; and
forming a second transistor having a second threshold voltage implant characteristic that is different than the first threshold voltage implant characteristic, wherein the first and second transistors are directly coupled in series between a power supply line and an output of the input-output circuitry on which the signal is provided, and wherein the first and second transistors have the same transistor channel doping type.

16. The method defined in claim 15, wherein the first transistor is an asymmetric transistor, and wherein the second transistor is a symmetric transistor.

17. The method defined in claim 16, wherein the asymmetric transistor comprises source-drain regions at different dopant concentration levels, and wherein the symmetric transistor comprises source-drain regions at identical dopant concentration levels.

18. The method defined in claim 16, wherein the first threshold voltage implant characteristics has a lower threshold voltage than that of the second threshold voltage implant characteristic.

19. The method defined in claim 15, wherein the first transistor has a lower threshold voltage than the second transistor.

20. The method defined in claim 16, further comprising:
forming a third transistor having a first threshold voltage implant characteristic;
forming a fourth transistor forming having a second threshold voltage implant characteristic, wherein the third and fourth transistors are coupled between a ground line and the output of the input-output circuitry on which the signal; and
forming an interconnection pathway between the third and fourth transistors.

\* \* \* \* \*